US009991752B1

(12) United States Patent  
Tani

(10) Patent No.: US 9,991,752 B1  
(45) Date of Patent: Jun. 5, 2018

(54) WIRELESS POWER FEEDING METHOD

(71) Applicant: Panasonic Corporation, Osaka (JP)

(72) Inventor: Hiroyuki Tani, Hyogo (JP)

(73) Assignee: PANASONIC CORPORATION, Osaka (JP)

( * ) Notice: Subject to any disclaimer, the term of this patent is extended or adjusted under 35 U.S.C. 154(b) by 0 days. days.

(21) Appl. No.: 15/815,767

(22) Filed: Nov. 17, 2017

(30) Foreign Application Priority Data

Dec. 7, 2016 (JP) .................................. 2016-237707  
Aug. 24, 2017 (JP) .................................. 2017-161394

(51) Int. Cl.  
*H02J 50/23* (2016.01)  
*G01R 21/00* (2006.01)

(52) U.S. Cl.  
CPC .............. *H02J 50/23* (2016.02); *G01R 21/00* (2013.01)

(58) Field of Classification Search  
CPC ................................ G01R 21/00; H02J 50/23  
USPC ......................................................... 307/104  
See application file for complete search history.

(56) References Cited

U.S. PATENT DOCUMENTS

| 7,936,095 | B2 | 5/2011 | Kawabata | |
|---|---|---|---|---|
| 8,159,364 | B2 * | 4/2012 | Zeine | H02J 7/025 340/693.1 |
| 8,446,248 | B2 * | 5/2013 | Zeine | H02J 50/20 340/5.1 |
| 2009/0146503 | A1 * | 6/2009 | Kawabata | G08C 17/02 307/104 |

FOREIGN PATENT DOCUMENTS

| JP | 2007-267110 | 10/2007 |
|---|---|---|
| JP | 2014-223018 | 11/2014 |
| WO | 2008/156571 | 12/2008 |
| WO | 2012/027166 | 3/2012 |

* cited by examiner

*Primary Examiner* — Daniel Kessie  
(74) *Attorney, Agent, or Firm* — Wenderoth, Lind & Ponack, L.L.P.

(57) ABSTRACT

A direction of the first power transmission antenna is detected in a power transmission stop state from the slave power transmission apparatus after detection of a power reception apparatus, by using a master power transmission apparatus including a first power transmission device and a first power transmission antenna and a slave power transmission apparatus including a second power transmission device and a plurality of the second power transmission antennas, a second power transmission antenna in which an amount of electric power received by the power reception apparatus becomes maximum is detected in the power transmission stop state from the master power transmission apparatus, and a phase of at least one power transmission radio wave of the master power transmission apparatus and the slave power transmission apparatus is adjusted to a phase in which the amount of the electric power received by the power reception apparatus becomes maximum.

6 Claims, 17 Drawing Sheets

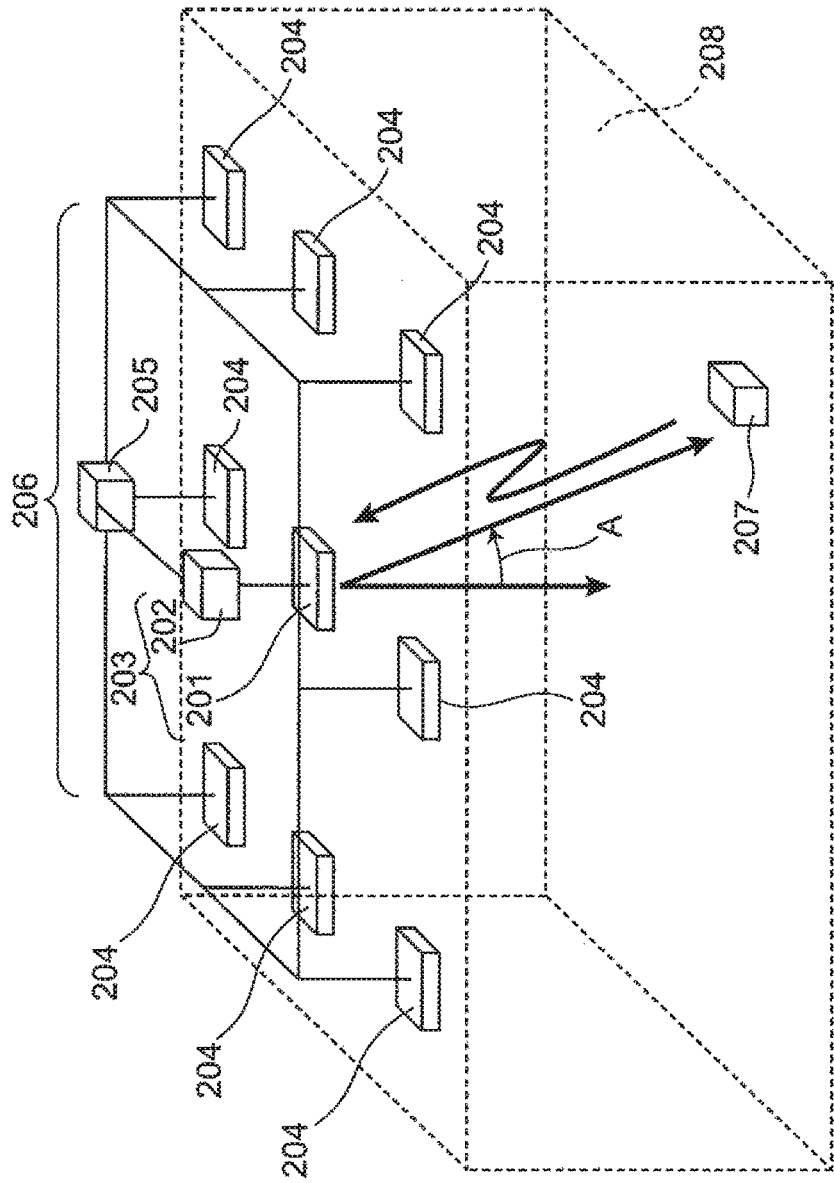

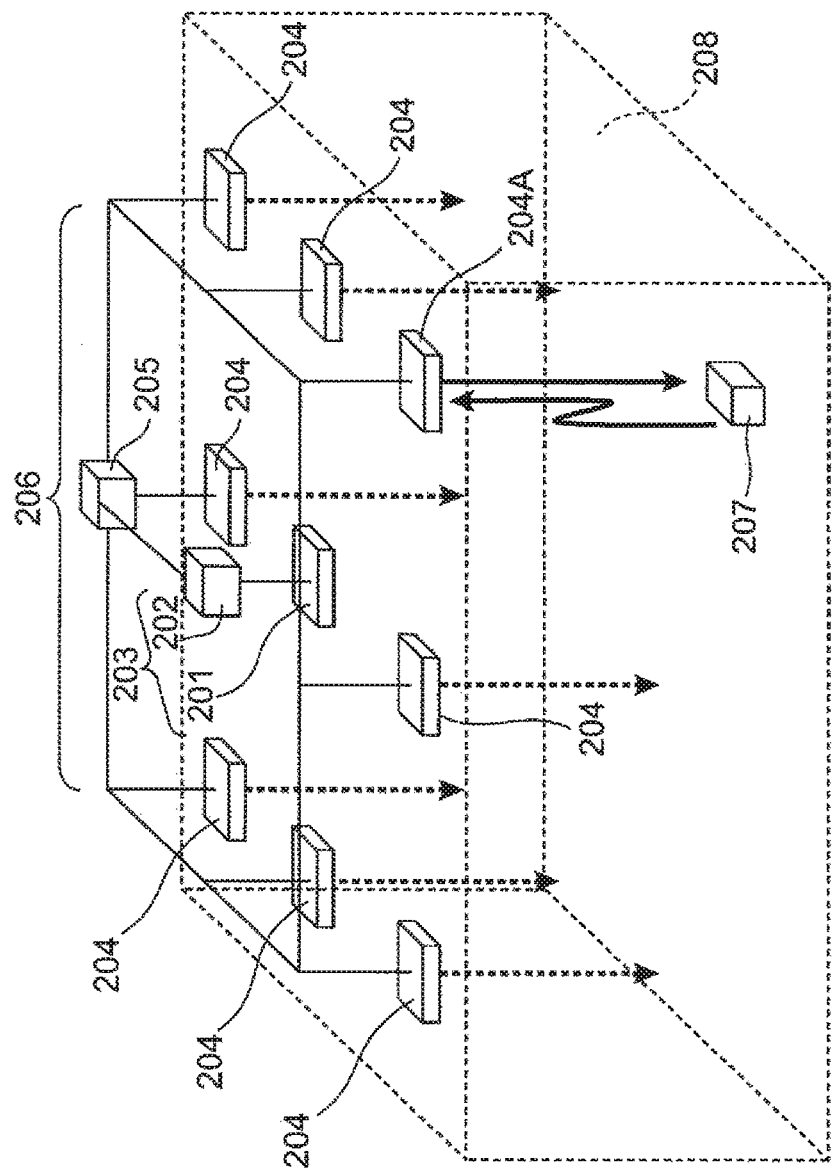

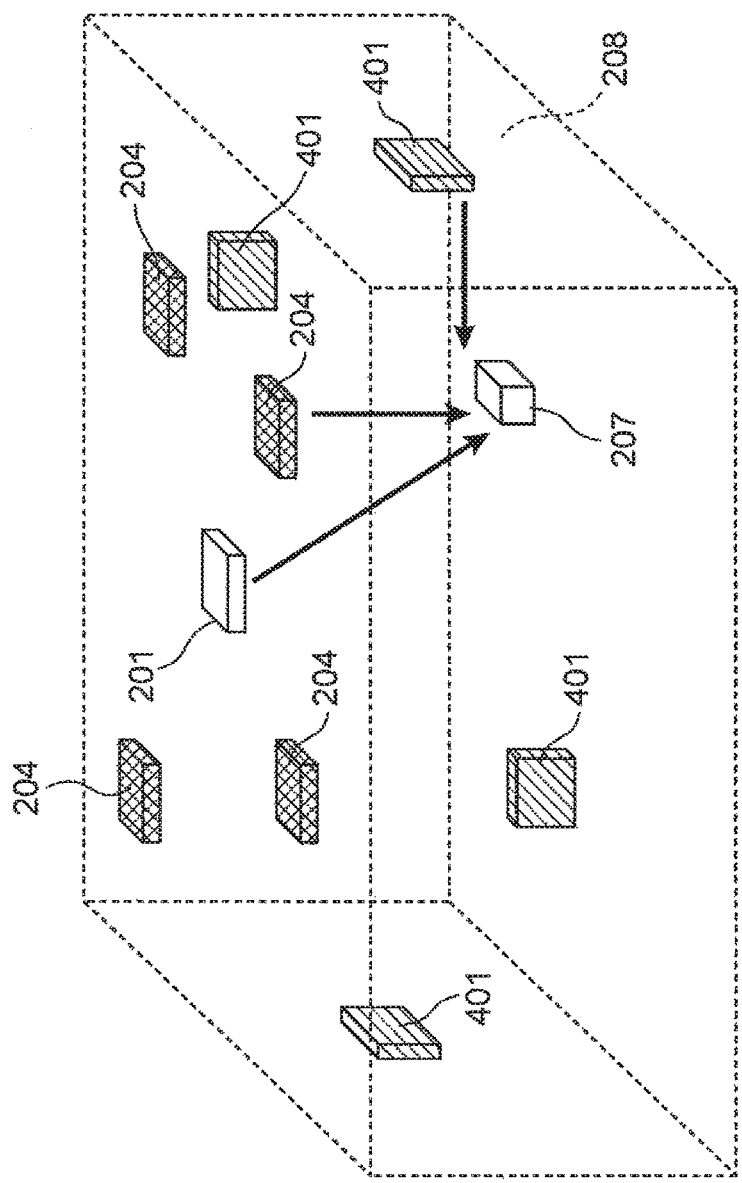

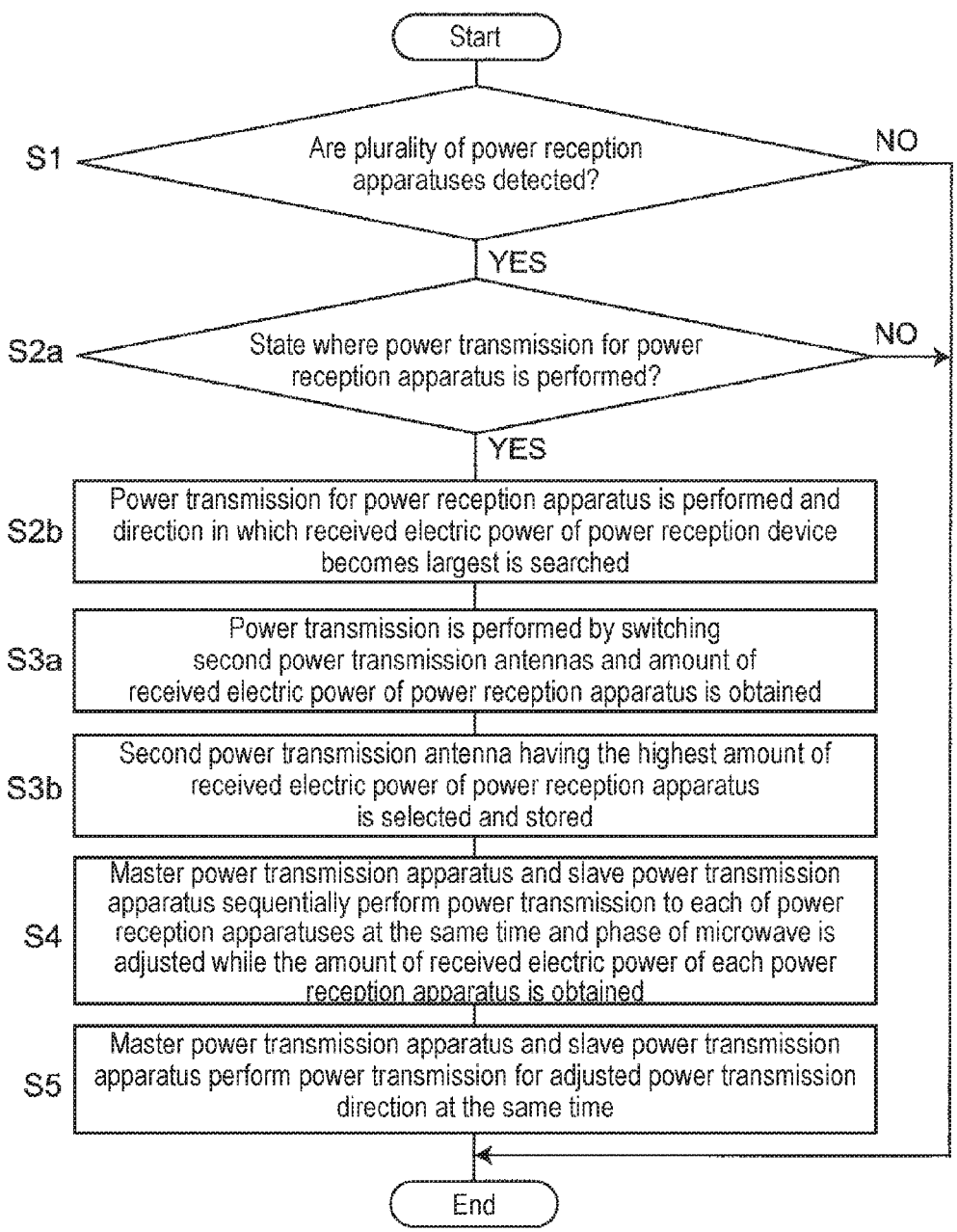

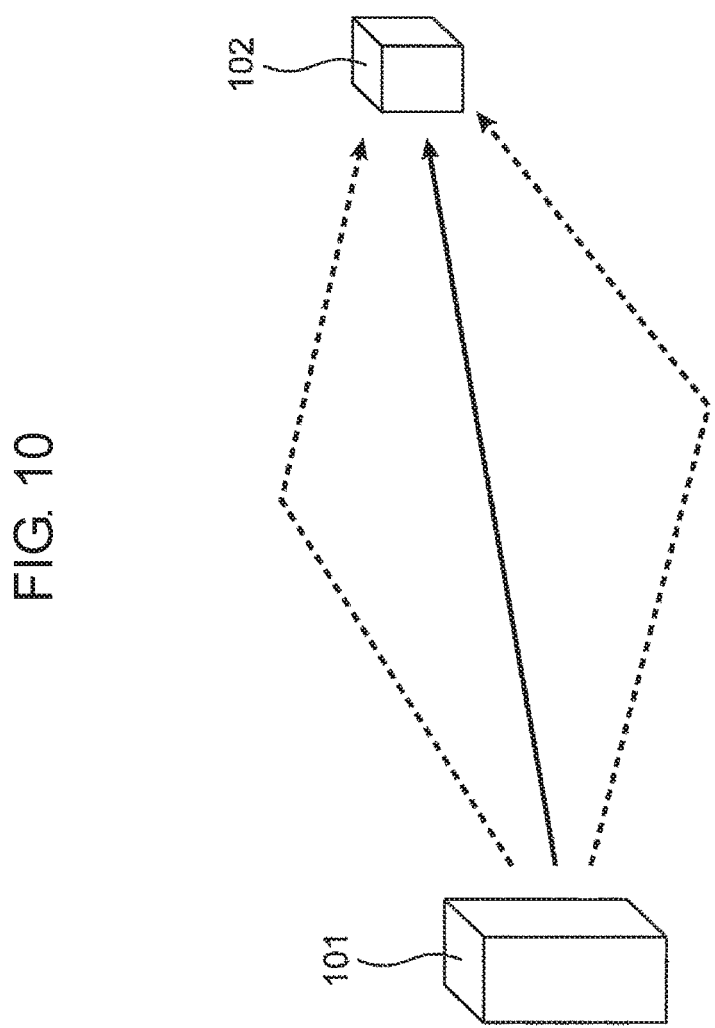

WIRELESS POWER FEEDING METHOD

BACKGROUND

1. Technical Field

The present disclosure relates to a wireless power feeding method for wirelessly supplying electric power by electromagnetic waves (microwaves).

2. Description of the Related Art

Recently, development of a technology for transmitting the electric power by the electromagnetic waves and for wirelessly supplying the electric power is processed.

As an example of a wireless power feeding technology by the electromagnetic waves, there is a method of using magnetic field coupling or resonance at a short distance of several m or less such as electromagnetic induction or magnetic resonance by using the electromagnetic waves of a frequency bandwidth of several 100 kHz to several MHz.

In addition, as a wireless electric power feeding method of a case where a distance from a power feeding device to a power reception device is far, there is a system using the microwaves.

By using a microwave beam of several 100 MHz to several GHz, it is possible to transmit the electric power to a remote power reception apparatus.

As an example of such a wireless electric power transmission system, there are systems such as a space solar power generation system that launches an artificial satellite equipped with a solar panel on the equator and transmits the electric power generated by sunlight to the power reception apparatus on the ground, a system that transmits the electric power to the power reception apparatus disposed in a remote island, and the like.

As described above, as compared to other methods, the electric power transmission method by the microwaves has a feature that the degree of freedom of the power transmission distance is high, and it is possible to use microwave power feeding as a power source of an electric vehicle or a robot and various wireless terminals in a relatively short distance.

A method of radiating the microwaves to the above-mentioned equipment disposed in space and wirelessly supplying the electric power aiming to eliminate the need to charge a sensor or mobile equipment using the electric power of several mW to several W levels or to exchange batteries is proposed.

However, since the microwave power feeding radiates radio waves to the space, there is a problem that it is difficult to recover and use all the radiated electric power and efficiency is low.

On the other hand, there is provided a method for communicating information between a device on the side of receiving the electric power and the power transmission system, calculating a path through which the electric power can be transmitted most efficiently in the space, and transmitting the microwaves to a direction of the path (Japanese Patent Unexamined Publication No. 2014-223018).

FIG. 10 is a diagram illustrating a microwave power feeding method in the related art.

Power transmission apparatus 101 transmits a microwave to power reception apparatus 102, calculates a path through which power transmission can be most efficiently performed, and controls a power transmission direction of the microwave in a direction through the path, whereby the power transmission is efficiently realized.

SUMMARY

To achieve the above object, according to an aspect of the disclosure, provided is a wireless power feeding method for transmitting electric power to one power reception apparatus to a plurality of power transmission apparatuses by using a wireless power feeding system, in which the plurality of the power transmission apparatuses are configured with a master power transmission apparatus including a first power transmission device and a first power transmission antenna connected to the first power transmission device and a slave power transmission apparatus including a second power transmission device and a plurality of second power transmission antennas connected to the second power transmission device, the method including: a first step of detecting the power reception apparatus within a power transmission range of the master power transmission apparatus by the master power transmission apparatus; a second step of detecting a direction of the first power transmission antenna in which an amount of the electric power received by the power reception apparatus becomes maximum, by performing power transmission from the master power transmission apparatus to the power reception apparatus, while changing a direction of the first power transmission antenna of the master power transmission apparatus, in a state where the power transmission from the slave power transmission apparatus is stopped; a third step of detecting the second power transmission antenna in which the amount of the electric power received by the power reception apparatus becomes maximum, by performing the power transmission from the slave power transmission apparatus to the power reception apparatus while sequentially switching the plurality of the second power transmission antennas of the slave power transmission apparatus one by one by stopping the power transmission from the master power transmission apparatus is stopped and; a fourth step of adjusting a phase of at least one radio wave transmitted from the master power transmission apparatus and the slave power transmission apparatus to a phase in which the amount of the electric power received by the power reception apparatus becomes maximum, while performing the power transmission from both the first power transmission antenna and the detected second power transmission antenna to the power reception apparatus; and a fifth step of transmitting the electric power from both the first power transmission antenna and the detected second power transmission antenna to the power reception apparatus based on the adjusted phase.

These general and specific aspects may be realized by a system, a method, a computer program and a computer system, and any combination of the method and the computer program.

As described above, the wireless power feeding method according to the aspect of this disclosure can efficiently supply high electric power to power reception apparatuses arranged in a wide space without radio wave interference, by using a plurality of power transmission apparatuses.

BRIEF DESCRIPTION OF THE DRAWINGS

FIG. 2A is an explanatory diagram illustrating an adjustment method relating to a transmission direction of the master power transmission apparatus used in the wireless power feeding method;

FIG. 3A is an explanatory diagram illustrating an adjustment method of the slave power transmission apparatus used in the wireless power feeding method;

FIG. 6 is an explanatory diagram illustrating still another power transmission antenna arrangement used in the wireless power feeding method;

FIG. 7B is a flowchart illustrating an adjustment method of the master power transmission apparatus in a case where the plurality of power reception apparatuses are present;

FIG. 10 is an explanatory diagram illustrating a wireless power feeding method in the related art.

DETAILED DESCRIPTIONS

Prior to the description of the embodiments, problems in the related art will be briefly described.

In a wireless power feeding method in the related art, when assuming that it is used in wide space, there is a problem that a distance between a power transmission apparatus and a power reception apparatus in a single power transmission apparatus increases, whereby radio wave attenuates, and efficiency decreases, and since there is a legal limitation on transmitted electric power, there is a limit to the electric power that can be supplied to the power reception apparatus.

An object of this disclosure is to provide a wireless power feeding method for efficiently supplying high electric power to the power reception apparatuses disposed in the wide space without radio wave interference by using a plurality of power transmission devices.

Hereinafter, an embodiment of this disclosure will be described with reference to the drawings.

Configuration of Wireless Power Supply System

Figure 1A:
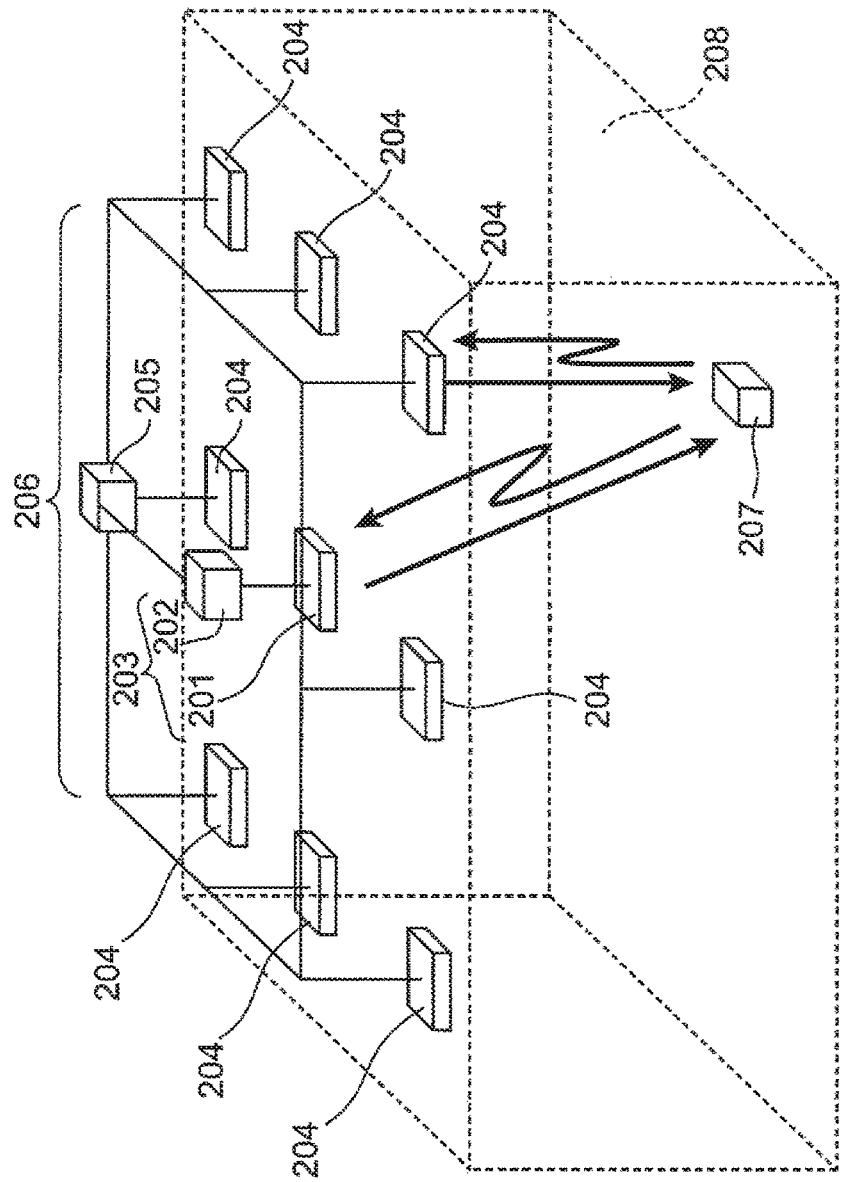
FIG. 1A is an explanatory diagram illustrating a wireless power feeding method according to an embodiment of this disclosure.

FIG. 1A is a diagram illustrating a wireless power feeding system performed by the wireless power feeding method according to the embodiment.

Figure 1B:
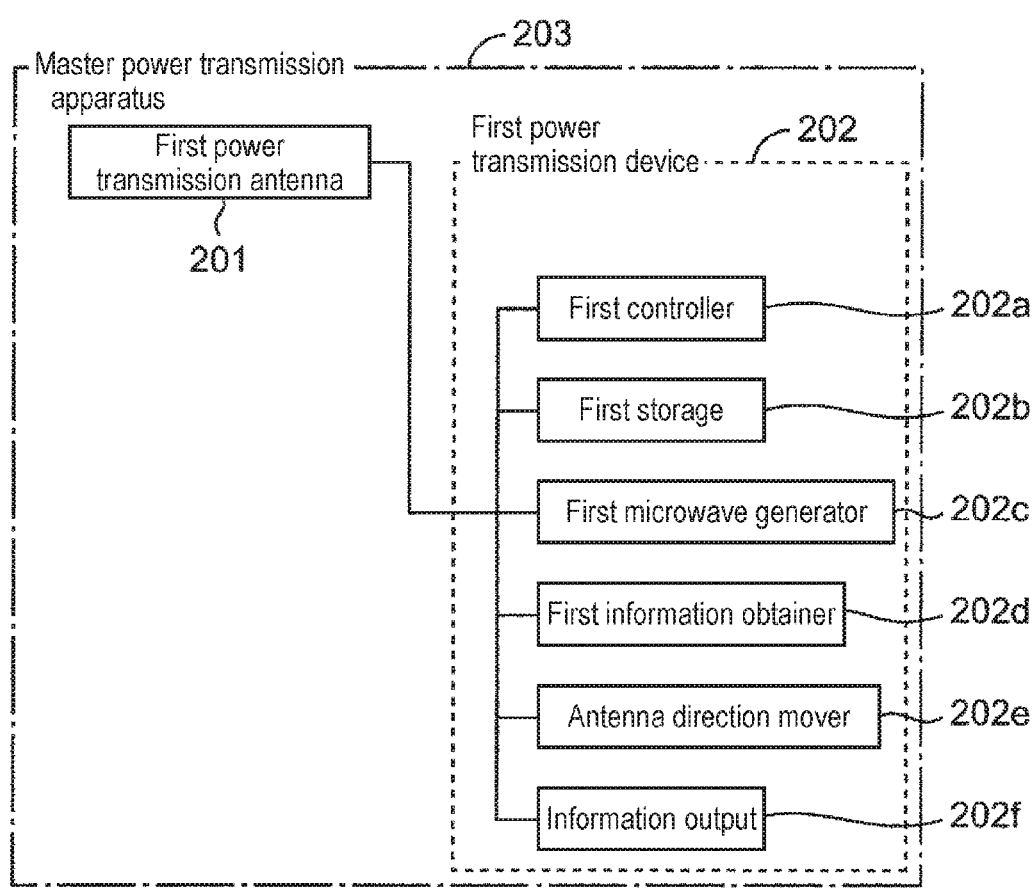
FIG. 1B is a block diagram illustrating a configuration of a master power transmission apparatus used in the wireless power feeding method.
Figure 1C:
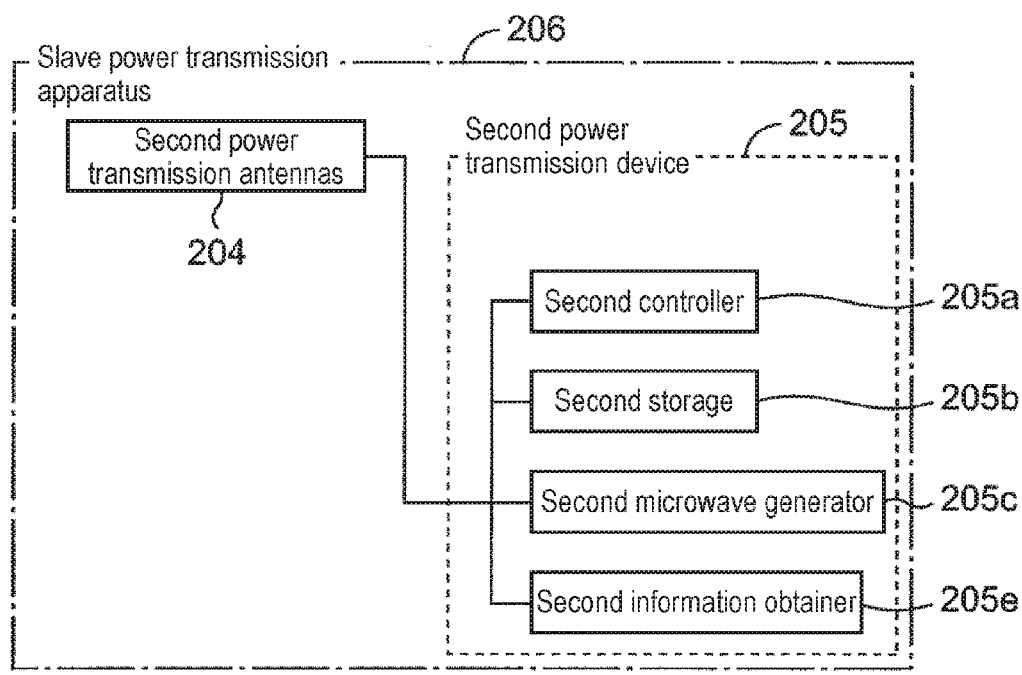
FIG. 1C is a block explanatory diagram illustrating a configuration of a slave power transmission apparatus used in the wireless power feeding method.
Figure 1D:
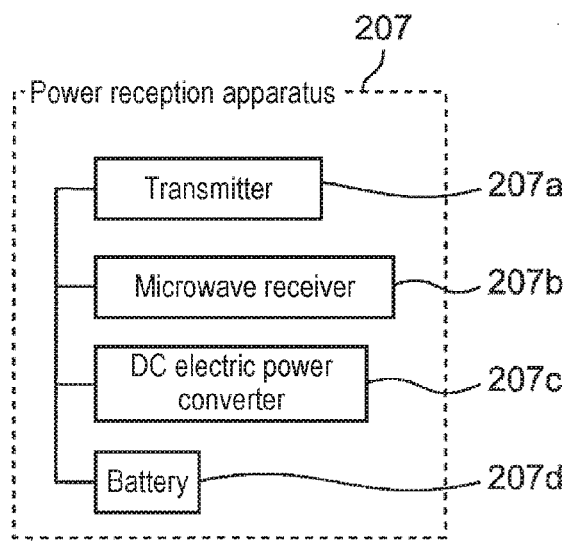
FIG. 1D is a block explanatory diagram illustrating a configuration of a power reception apparatus used in the wireless power feeding method.

Each of FIG. 1B to FIG. 1D is a specific configuration diagram of master power transmission apparatus 203 and slave power transmission apparatus 206 configuring a plurality of power transmission apparatuses of the wireless power feeding system, and power reception apparatus 207.

The wireless power feeding system includes master power transmission apparatus 203 and slave power transmission apparatus 206.

As illustrated in FIG. 1B, master power transmission apparatus 203 is configured with first power transmission antenna 201 that radiates microwaves within power transmission range 208, and first power transmission device 202 including first controller 202a that controls to generate the microwaves to be radiated from first microwave generator 202c and controls a power transmission direction thereof, first storage 202b, and the like which are connected to first power transmission antenna 201.

Details of a configuration of first power transmission device 202 will be described below.

As an example, as illustrated in FIG. 1A, first power transmission antenna 201 is disposed above the center of power transmission range 208.

For example, information required for an operation of master power transmission apparatus 203, information required for a control operation of first controller 202a, information obtained by a controlled result, and the like are stored in first storage 202b.

As illustrated in FIG. 1C, slave power transmission apparatus 206 is configured with a plurality of second power transmission antennas 204 that radiate the microwaves by arranging at positions different from those of first power transmission antenna 201 within power transmission range 208 and second power transmission device 205 including second controller 205a that is connected to second power transmission antennas 204 and controls a phase adjustment function by switching second power transmission antennas 204 thereof, second storage 205b, and the like.

Details of a configuration of second power transmission device 205 will be described below.

Figure 4A:
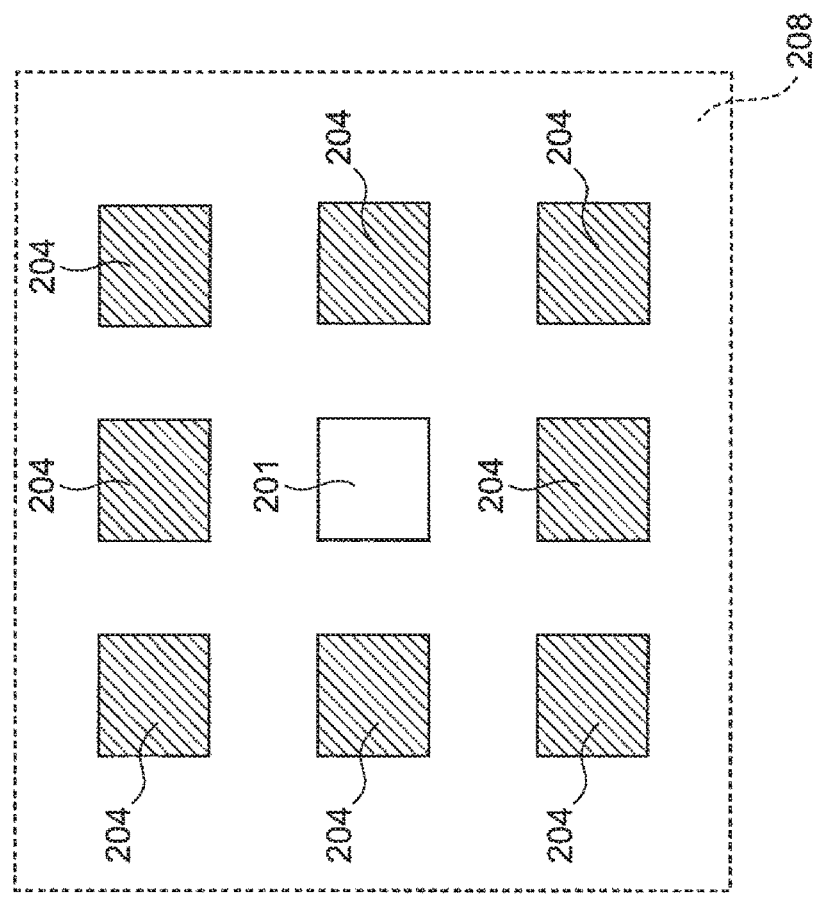
FIG. 4A is an explanatory diagram illustrating a power transmission antenna arrangement used in the wireless power feeding method.

As an example, second power transmission antennas 204 are arranged around first power transmission antenna 201, for example, on four sides of the periphery of first power transmission antenna 201 (see FIG. 4A).

Information required for an operation of slave power transmission apparatus 206, information required for a control operation of second controller 205a, information obtained by a controlled result, and the like are stored in second storage 205b.

First power transmission device 202 and second power transmission device 205 are connected to each other and required information can be communicated therebetween, whereby, for example, information of power transmission start information or the like can be transmitted from first power transmission device 202 to second power transmission device 205.

As illustrated in FIG. 1D, power reception apparatus 207 to be a power feeding target includes transmitter 207a, microwave receiver 207b, DC electric power converter 207c, and battery 207d.

Power reception device 207 includes transmitter 207a that transmits presence information meaning that power reception apparatus 207 is present, power reception information in microwave receiver 207b, and charge state information of battery 207d, microwave receiver 207b, DC electric power converter 207c, and battery 207d.

Figure 1E:
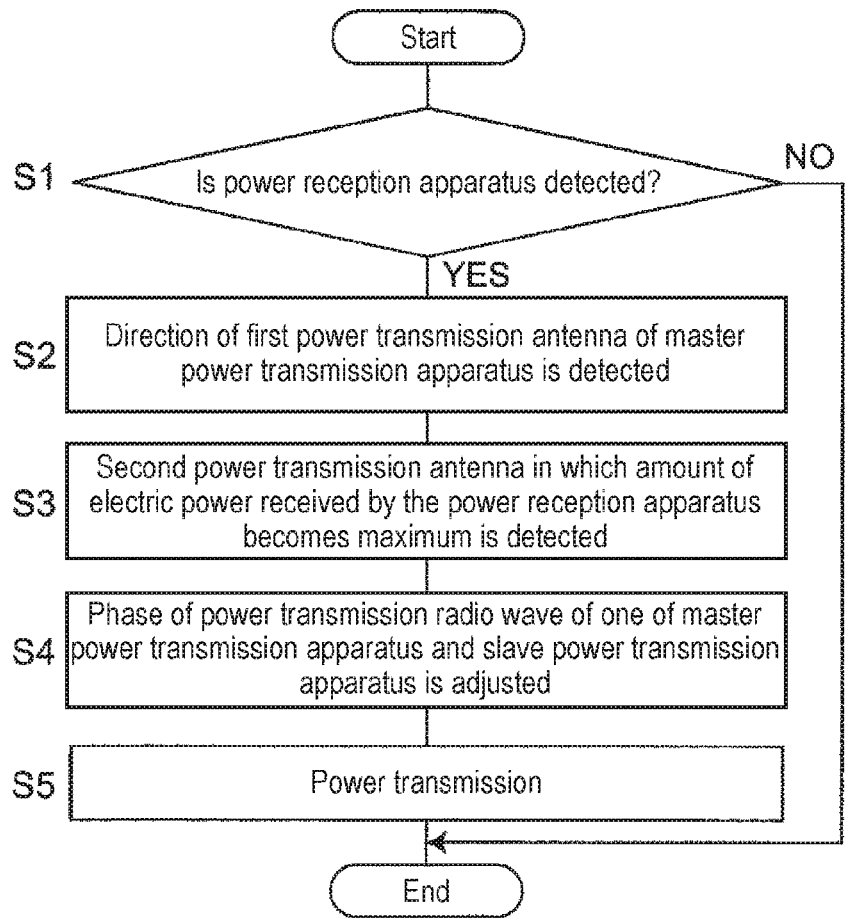
FIG. 1E is a flowchart illustrating the wireless power feeding method.
Figure 1F:
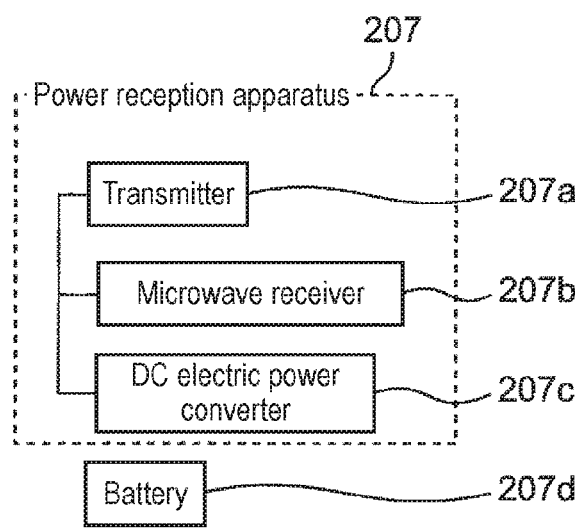
FIG. 1F is a block explanatory diagram illustrating a configuration of a power reception apparatus used in a wireless power feeding method according to a modification example.

As illustrated in FIG. 1F, power reception apparatus 207 may include battery 207d separated from power reception apparatus 207 outside power reception apparatus 207 without including battery 207d as a part of a configuration component and may connect power reception apparatus 207 and battery 207d to each other if necessary only.

In addition, power reception apparatus 207 does not include battery 207d, and power reception apparatus 207 may use the received electric power without charging.

When power reception apparatus 207 is positioned within power transmission range 208, transmitter 207a generates the presence information, the microwaves radiated from each of first microwave generator 202c of master power transmission apparatus 203 and second microwave generator 205c of slave power transmission apparatus 206 are received in microwave receiver 207b, the radiated microwaves are converted into DC electric power by DC electric power converter 207c, and the converted DC electric power is used as its own power source or charge electric power for battery 207d.

First power transmission device 202 of master power transmission apparatus 203 includes first controller 202a, first storage 202b, first information obtainer 202d, antenna direction mover 202e, and information output 202f.

Under the control of first controller 202a, first information obtainer 202d of master power transmission apparatus 203 can obtain information (that is, presence information) of presence or absence of power reception apparatus 207 within power transmission range 208 from power reception apparatus 207 by wireless communication, and microwave receiver 207b of power reception apparatus 207 can obtain the power reception information of the amount (that is, amount of reception electric power) of the received electric power or the like from transmitter 207a of power reception apparatus 207 by the wireless communication in first information obtainer 202d, by transmitting the electric power from first microwave generator 202c to a certain direction within power transmission range 208 while a direction of first power transmission antenna 201 is changed by antenna direction mover 202e by using first power transmission antenna 201 in first power transmission device 202.

The obtained information can be output from information output 202f.

As a configuration in which a direction of first power transmission antenna 201 is changed by antenna direction mover 202e, it can be performed with, for example, a device that mechanically rotates a direction of an antenna with a motor or the like or with a circuit that electrically controls the power transmission direction of the antenna.

In addition, second power transmission device 205 of slave power transmission apparatus 206 includes second controller 205a, second storage 205b, second microwave generator 205c, and second information obtainer 205e.

Even in slave power transmission apparatus 206, under the control of second controller 205a, microwave receiver 207b of power reception apparatus 207 can obtain the amount of the received electric power from transmitter 207a of power reception apparatus 207 by the wireless communication in second information obtainer 205e, by performing transmission of the electric power into power transmission range 208 in second microwave generator 205c by using second power transmission antennas 204 in second power transmission device 205.

Wireless Power Supply Method

As illustrated in FIG. 1E, the wireless power feeding method in the embodiment is configured with the following five steps S1 to S5.

First Step S1

First, in first step S1, under the control of first controller 202a, the microwaves are radiated within power transmission range 208 by using first microwave generator 202c of master power transmission apparatus 203, whereby first power transmission device 202 determines detection of presence or absence of power reception apparatus 207 and power transmission start in second step S2.

In first step S1, as a result of obtaining information of presence or absence of the presence information transmitted from transmitter 207a of power reception apparatus 207 by the wireless communication in first information obtainer 202d of first power transmission device 202, when first controller 202a of first power transmission device 202 determines that there is no power reception apparatus 207 within power transmission range 208, the power transmission from master power transmission apparatus 203 in second step S2 is stopped by first controller 202a.

Meanwhile, in first step S1, as a result of obtaining the information of the presence or absence of the presence information transmitted from transmitter 207a of power reception apparatus 207 by the wireless communication in first information obtainer 202d of first power transmission device 202, when first controller 202a of first power transmission device 202 determines that there is the presence information of power reception apparatus 207 within power transmission range 208, the process proceeds to second step S2.

Second Step S2

In second step S2, under the control of first controller 202a of first power transmission device 202, the power transmission from first microwave generator 202c starts.

That is, when the power transmission start is performed by first controller 202a in second step S2, under the control of first controller 202a, first controller 202a searches for a direction in which the power transmission can be most efficiently performed by performing the power transmission from first microwave generator 202c and by controlling the power transmission direction, while the direction of first power transmission antenna 201 is changed by antenna direction mover 202e.

At this time, first, the power transmission is performed by first microwave generator 202c while the power transmission direction is controlled by changing the direction of first power transmission antenna 201 by antenna direction mover 202e of first power transmission device 202, and the amount of the received electric power transmitted from transmitter 207a of power reception apparatus 207 and included in the power reception information in microwave receiver 207b of power reception apparatus 207 is obtained by first information obtainer 202d by the wireless communication.

This is performed within a predetermined angle including a range in which power reception apparatus 207 is present, for example, within a range of 360°, and first controller 202a searches for a direction in which the power transmission can be most efficiently performed.

The direction in which the power transmission can be most efficiently performed is a direction in which the amount of the electric power received by power reception apparatus 207 is maximum.

As a result, from information output 202f of first power transmission device 202 to second information obtainer 205e of second power transmission device 205, a signal including information of the direction in which the power transmission can be most efficiently performed searched by master power transmission apparatus 203 is output as a signal of adjustment completion.

Third Step S3

Next, in third step S3, the power transmission using slave power transmission apparatus 206 is performed.

In second controller 205a of second power transmission device 205 of slave power transmission apparatus 206, the power transmission is performed by sequentially switching second power transmission antennas 204, and one second power transmission antenna 204 which can transmit the highest electric power from second microwave generator 205c is selected among the plurality of second power transmission antennas 204.

Selection in third step S3 is not limited to select second power transmission antennas 204 which can transmit the highest electric power.

For example, position information of second power transmission antennas 204 is stored in second storage 205b connected to second controller 205a in advance, and second power transmission antennas 204 at a position closest to the direction in which the power transmission can be most efficiently performed obtained from information output 202f of first power transmission device 202 can be performed by being selected by second controller 205a.

Information selected by second controller 205a can also be stored in second storage 205b.

Fourth Step S4

In fourth step S4, in a state where transmission from second power transmission antennas 204 and first power transmission antenna 201 of master power transmission apparatus 203 selected in third step S3 is performed at the same time, second controller 205a adjusts second microwave generator 205c (or, first controller 202a adjusts first microwave generator 202c) so as to change power transmission radio wave from second microwave generator 205c of second power transmission device 205, that is, a phase of the microwave to a phase in which the highest electric power can be transmitted.

Fifth Step S5

In fifth step S5, based on the adjusted phase, by using two power transmission apparatuses, that is, first microwave generator 202c of master power transmission apparatus 203 and second microwave generator 205c of slave power transmission apparatus 206, the high electric power is efficiently transmitted to power reception apparatus 207.

Details of second step S2 in the wireless power feeding method will be described below.

Adjustment Method Relating to Power Transmission Direction of Master Power Transmission Apparatus 203 in Second Step S2

Figure 2B:
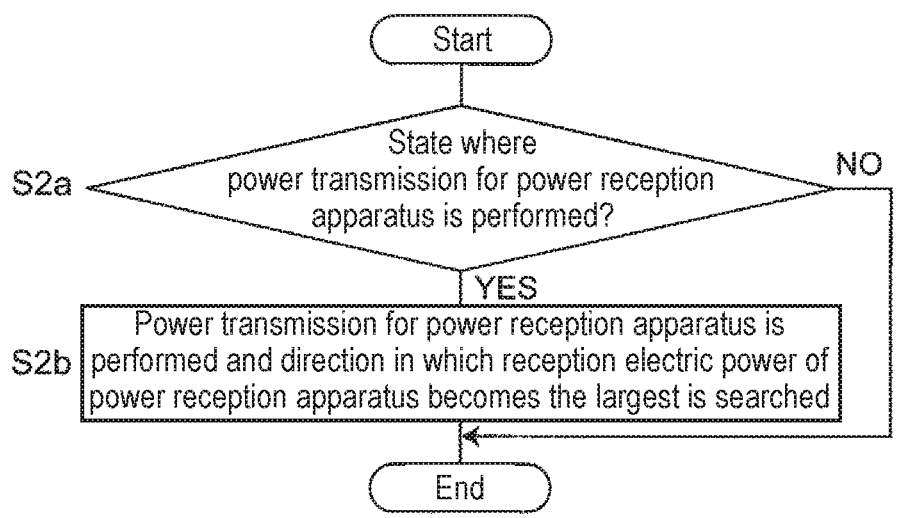
FIG. 2B is a flowchart illustrating the adjustment method relating to the transmission direction of the master power transmission apparatus used in the wireless power feeding method.

First, an adjustment method of master power transmission apparatus 203 will be described in detail by using FIG. 2A and FIG. 2B.

In first step 51 before second step S2, first controller 202a of master power transmission apparatus 203 detects the presence information of power reception apparatus 207 within power transmission range 208.

In this detection state, master power transmission apparatus 203 knows that power reception apparatus 207 presents within power transmission range 208, but power reception apparatus 207 is unknown to the position thereof.

Next, in second step S2, first, as step S2a, first controller 202a of first power transmission device 202 of master power transmission apparatus 203 determines a state where the power transmission for power reception apparatus 207 is performed.

That is, information of a charge state of battery 207d transmitted from transmitter 207a of power reception apparatus 207 is obtained by first information obtainer 202d, and first controller 202a of master power transmission apparatus 203 determines a state where power reception apparatus 207 can receive the electric power.

For example, based on information of a charge state of power reception apparatus 207, master power transmission apparatus 203 does not perform the power transmission in a case where first controller 202a determines that charged electric power of power reception apparatus 207 is in the maximum state and it is not necessary to perform power reception, or in a case where first controller 202a determines that power reception apparatus 207 is moved and it is not in a state where power reception can be stably received,.

Here, as described below, first controller 202a can determine whether or not power reception apparatus 207 is moving.

That is, as an example, in a state where master power transmission apparatus 203 performs the power transmission, the received electric power of power reception apparatus 207 is changed, and when first controller 202a determines that it is not stable state, first controller 202a can determine that power reception apparatus 207 is moving.

In addition, a method of determining, by first controller 202a, a state where the power transmission for power reception apparatus 207 is performed includes the following method.

For example, a method in which the power transmission from master power transmission apparatus 203 is not started until it is determined that first controller 202a of master power transmission apparatus 203 receives a signal (in other words, power transmission start information) of the power transmission start transmitted from transmitter 207a of power reception apparatus 207, may be implemented.

Alternatively, the amount of the received electric power transmitted from transmitter 207a of power reception apparatus 207 is continuously obtained by first information obtainer 202d of master power transmission apparatus 203, and the amount of the electric power is stable. That is, when first controller 202a of master power transmission apparatus 203 determines that change is small, first controller 202a may determine that the power transmission from master power transmission apparatus 203 is started.

As step S2b after step S2a, if first controller 202a of master power transmission apparatus 203 can determine that the power transmission from master power transmission apparatus 203 is performed, the power transmission from first microwave generator 202c of master power transmission apparatus 203 is performed.

At this time, first controller 202a of first power transmission device 202 controls the power transmission direction so as to continuously change as indicated by an arrow A in FIG. 2A, a direction in which the received electric power of the power reception device 207 becomes the largest is searched by first controller 202a of first power transmission device 202, and the power transmission direction is fixed by first power transmission device 202 in the direction.

With this, an adjustment relating to the power transmission direction of master power transmission apparatus 203 is completed.

Third step S3 in the wireless power feeding method will be described in detail below.

In Third Step S3 and S4, Adjustment Method of Slave Power Transmission Apparatus 206

Figure 3B:
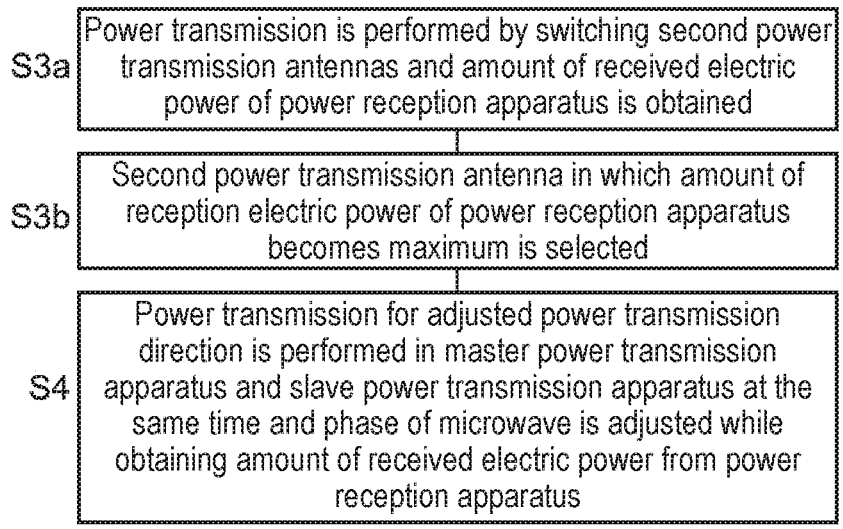
FIG. 3B is a flowchart illustrating the adjustment method of the slave power transmission apparatus used in the wireless power feeding method.

An adjustment method of slave power transmission apparatus 206 will be described by using FIG. 3A and FIG. 3B.

After completion of second step S2, as a state where the power transmission of master power transmission apparatus 203 is stopped, and second controller 205a of second power transmission device 205 of slave power transmission apparatus 206 to which an adjustment completion signal is received from first power transmission device 202 of master power transmission apparatus 203 first performs the power transmission from second microwave generator 205c by switching second power transmission antennas 204 to be sequentially transmitted as step S3a in step S3, and obtains the amount of the received electric power of power reception apparatus 207 by second information obtainer 205e from power reception apparatus 207 by the wireless communication.

As step S3b in step S3, second power transmission antenna 204 having the largest amount of the received electric power of power reception apparatus 207 among second power transmission antennas 204 is selected by second controller 205a of second power transmission device 205, and selected second power transmission antenna 204 causes the power transmission to be performed from second microwave generator 205c of slave power transmission apparatus 206 by using second controller 205a.

Then, step S3 is completed.

Next, as step S4, in a state where the power transmission is performed in selected second power transmission antenna 204 (see reference numeral 204A in FIG. 3A), first power transmission device 202 of master power transmission apparatus 203 to which an antenna selection completion signal is received from second power transmission device 205 of slave power transmission apparatus 206 performs the power transmission for the adjusted power transmission direction at the same time, and obtains the amount of the received electric power of power reception apparatus 207 by slave power transmission apparatus 206 from power reception apparatus 207 by the wireless communication.

Slave power transmission apparatus 206 adjusts a phase of the microwave of second power transmission device 205 of slave power transmission apparatus 206, while obtaining the amount of the received electric power from power reception apparatus 207, whereby the phase is adjusted to a phase at which the amount of the received electric power from power reception apparatus 207 becomes the largest.

With this, antenna switching and phase adjustment of slave power transmission apparatus 206 are completed.

Effect

By the above-described method, power transmission direction adjustment and the phase adjustment of master power transmission apparatus 203 and slave power transmission apparatus 206 are completed, and thus it is possible to efficiently transmit the high electric power to power reception apparatuses 207 arranged in the wide space, without the radio wave interference by using first power transmission device 202 of master power transmission apparatus 203 and second power transmission device 205 of slave power transmission apparatus 206.

Modification Example

In the embodiment, by adjusting the phase of the microwave of slave power transmission apparatus 206, phase synthesis between master power transmission apparatus 203 and slave power transmission apparatus 206 is performed. However, by setting a phase adjustment function in a master power transmission apparatus 203 side, the phase adjustment may be performed in master power transmission apparatus 203.

In the embodiment, the adjustment is performed as an order of the power transmission direction adjustment of master power transmission apparatus 203, and the antenna switching and the phase adjustment of slave power transmission apparatus 206. However, an order in which after the antenna switching of slave power transmission apparatus 206, the power transmission direction adjustment of master power transmission apparatus 203 is performed, and then the phase adjustment is performed may be performed.

Next, antenna arrangement of master power transmission apparatus 203 and slave power transmission apparatus 206 will be described.

As a method of antenna arrangement, arrangement in which first power transmission antenna 201 of master power transmission apparatus 203 controls the power transmission direction such that the electric power can be transmitted to overall of power transmission range 208, may be implemented, and the arrangement is determined according to a surrounding situation of power transmission range 208.

Second power transmission antennas 204 of slave power transmission apparatus 206 are arranged in a place to which master power transmission apparatus 203 cannot transmit sufficient electric power in a manner by which the electric power is complemented.

In the embodiment illustrated in FIG. 1A, as arrangement of first power transmission antenna 201 of master power transmission apparatus 203 and second power transmission antennas 204 of slave power transmission apparatus 206, the arrangement viewed from above is illustrated in FIG. 4A.

In this arrangement, first power transmission antenna 201 of a master side is disposed in the center of a rectangular shape power transmission range 208, and eight second power transmission antennas 204 of a slave side are arranged on four sides of the periphery of first power transmission antenna 201. However, an arrangement relationship between the number of second power transmission antennas 204 of the slave side and first power transmission antenna 201 of the master side is not limited thereto.

In addition, in the embodiment, one slave power transmission apparatus 206 is configured with respect to one master power transmission apparatus 203, but a plurality of slave power transmission apparatuses 206 may be configured as another modification example.

Figure 5:
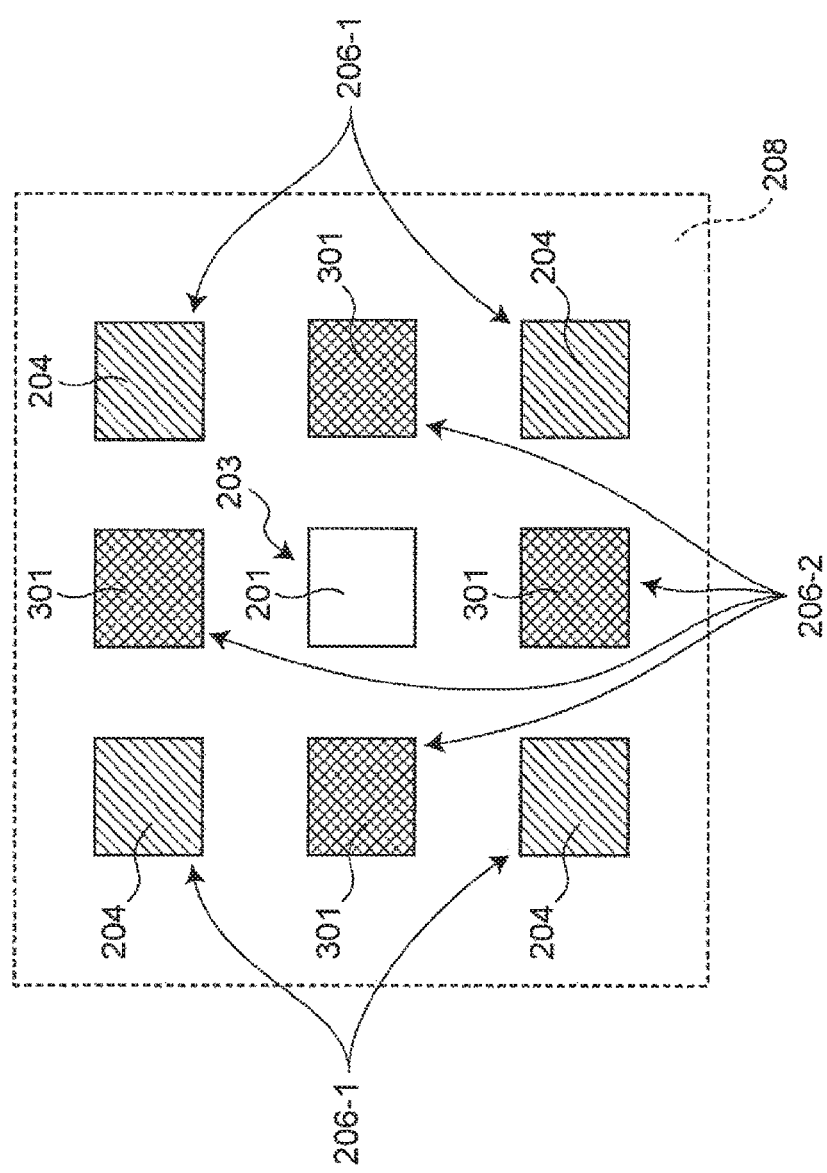
FIG. 5 is an explanatory diagram illustrating another power transmission antenna arrangement used in the wireless power feeding method.

An arrangement example of antenna arrangement in a case where the plurality of slave power transmission apparatuses 206 are configured, for example, in a case where two slave power transmission apparatuses 206 are configured is illustrated in FIG. 5.

As an example, second power transmission antennas 204 of first slave power transmission apparatus 206-1 and second power transmission antenna 301 of second slave power transmission apparatus 206-2 are alternately arranged on the periphery of first power transmission antenna 201 of master power transmission apparatus 203 which is disposed in the center.

As an example, first controller 202a of master power transmission apparatus 203 is configured to perform the following operation control of first slave power transmission apparatus 206-1 and second slave power transmission apparatus 206-2.

In this case, in step S5, by performing the power transmission in master power transmission apparatus 203 and a plurality of slave power transmission apparatuses 206-1 and 206-2 at the same time, it is possible to supply more higher electric power to power reception apparatus 207.

Figure 4B:
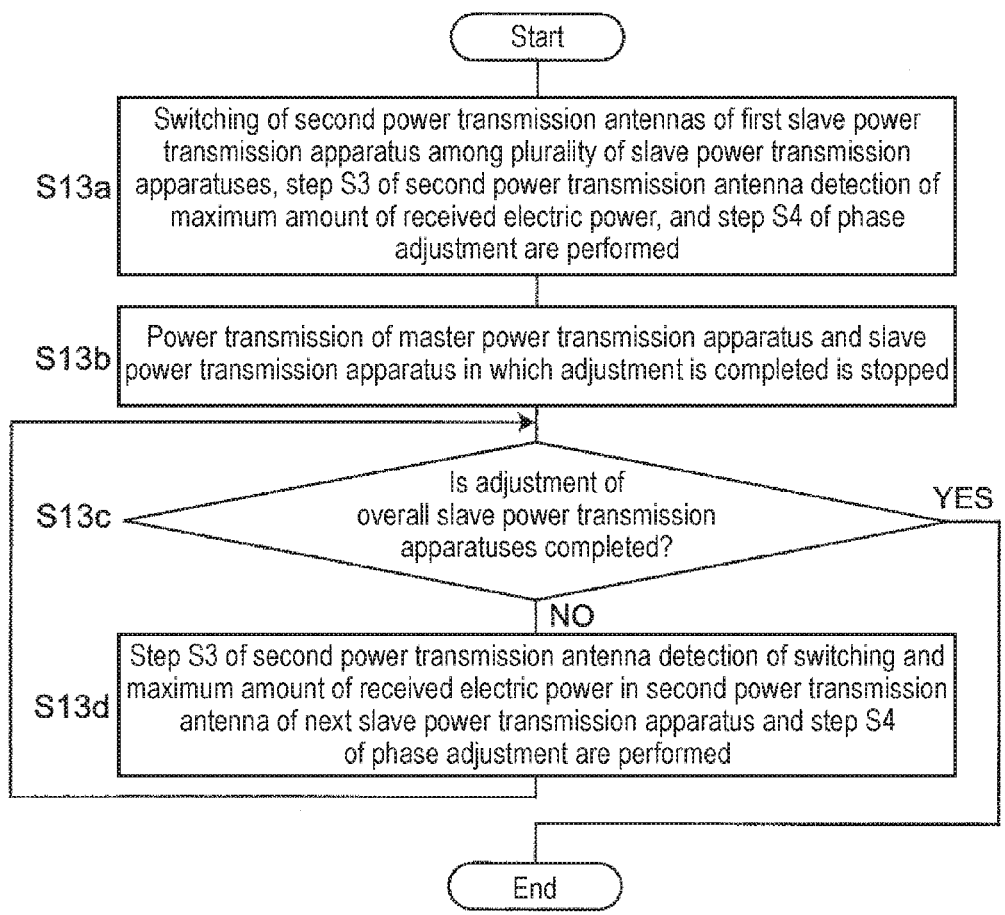
FIG. 4B is a flowchart illustrating a part of the wireless power feeding method according to the modification example.

As in the following step S13a to step S13d illustrated in FIG. 4B, after completion of the power transmission direction adjustment of master power transmission apparatus 203 in step S2, the adjustment method is configured to perform step S5 after step S3 and step S4 are performed in each of the plurality of slave power transmission apparatuses 206-1 and 206-2.

That is, first, as step S13a, switching of second power transmission antennas 204 of first slave power transmission apparatus 206-1 among the plurality of slave power transmission apparatuses 206-1 and 206-2, and step S3 of second power transmission antenna detection of the maximum amount of the received electric power and step S4 of the phase adjustment are performed.

As step S13b, the power transmission of master power transmission apparatus 203 and slave power transmission apparatus 206-1 in which the adjustment is completed is stopped.

As step S13c, in a state where the power transmission is stopped, first controller 202a of master power transmission apparatus 203 determines presence or absence of unadjusted slave power transmission apparatus 206-2 among the plurality of slave power transmission apparatuses 206-1 and 206-2, and if there is no unadjusted slave power transmission apparatus 206-2, the process proceeds to step S5.

If there is unadjusted slave power transmission apparatus 206-2, as step S13d, step S3 of the second power transmission antenna detection in switching and the maximum amount of the received electric power in second power transmission antenna 301 of next slave power transmission apparatus 206-2 and step S4 of the phase adjustment are performed.

That is, in a state where the power transmission is performed on the overall of master power transmission apparatus 203 and slave power transmission apparatus 206-1 in which the adjustment is completed at the same time, the phase adjustment for a phase at which the received electric power of power reception apparatus 207 becomes the largest with respect to slave power transmission apparatus 206-2 to be an adjustment target is performed.

Returning to step S13c, step S13d is performed with respect to remaining unadjusted slave power transmission apparatus 206-2 in an order.

As a result, by sequentially performing step S3 of the second power transmission antenna detection and step S4 of the phase adjustment of the maximum amount of the received electric power according to the number of slave power transmission apparatuses 206, the overall adjustment is completed.

As described above, in step S5, the power transmission is performed in master power transmission apparatus 203 and the plurality of slave power transmission apparatuses 206-1 and 206-2 at the same time.

As still another modification example, as illustrated in FIG. 6, a configuration in which second power transmission antennas 401 are arranged on a side of power transmission range 208 in addition to antenna arrangement above power transmission range 208 with respect to power reception apparatus 207, may be implemented.

Second power transmission antennas 401 may be configured as a part of slave power transmission apparatus 206, may be configured as a part of second slave power transmission apparatus 206-2, and may be configured as a part of the third slave power transmission apparatus.

In addition, as further still another modification example, In the embodiment, there is one power reception apparatus 207, but one power reception apparatus 207 performing the power transmission at the same time may be used, and it is also possible to sequentially perform the power transmission by arranging a plurality of power reception apparatuses 207.

For a method in which the plurality of power reception apparatuses 207 sequentially perform the power transmission, first, an adjustment method of master power transmission apparatus 203 will be described by using FIG. 7A and FIG. 7B.

Figure 7A:
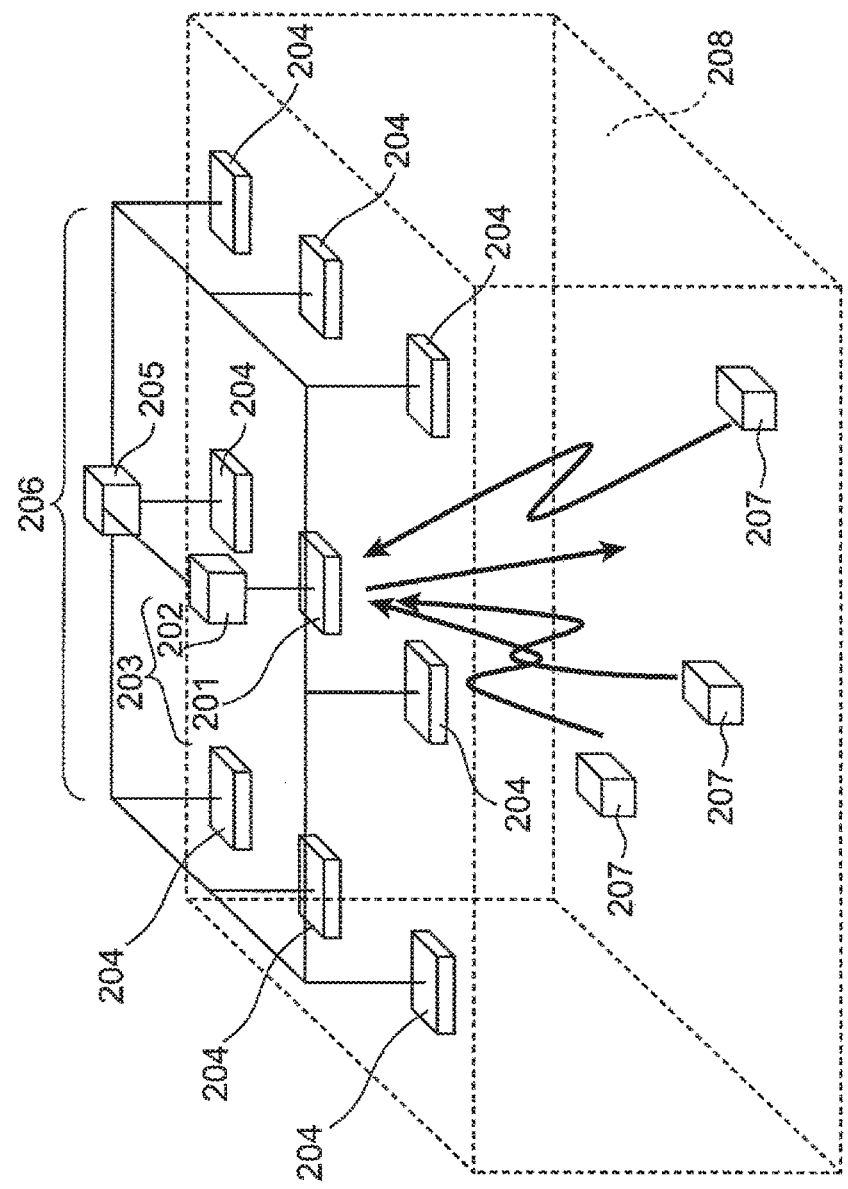
FIG. 7A is an explanatory diagram illustrating an adjustment method of the master power transmission apparatus in a case where a plurality of power reception apparatuses are present.

In FIG. 7A and FIG. 7B, as an example, an explanatory diagram and a flowchart of an operation of a case where three power reception apparatuses 207 as the plurality of power reception apparatuses 207 are arranged within power transmission range 208 of master power transmission apparatus 203 are illustrated.

First, in step S1, similar to FIG. 1E, master power transmission apparatus 203 detects the plurality of power reception apparatuses 207 within power transmission range 208.

In step S2a in second step S2, by the same method as that of the above step S2, first controller 202a determines a state where the power transmission in each of the plurality of power reception apparatuses 207 detected in step S1 is performed.

In step S2b in second step S2, master power transmission apparatus 203 performs the power transmission from first microwave generator 202c, by controlling the power transmission direction by first controller 202a of first power transmission device 202 so as to the power transmission direction to be continuously changed by antenna direction mover 202e, a direction in which the received electric power becomes the largest is searched by first controller 202a of first power transmission device 202 with respect to each of power reception apparatuses 207, and the power transmission direction in the direction is stored in first storage 202b of first power transmission device 202.

With this, second step S2 is completed.

Figure 8:
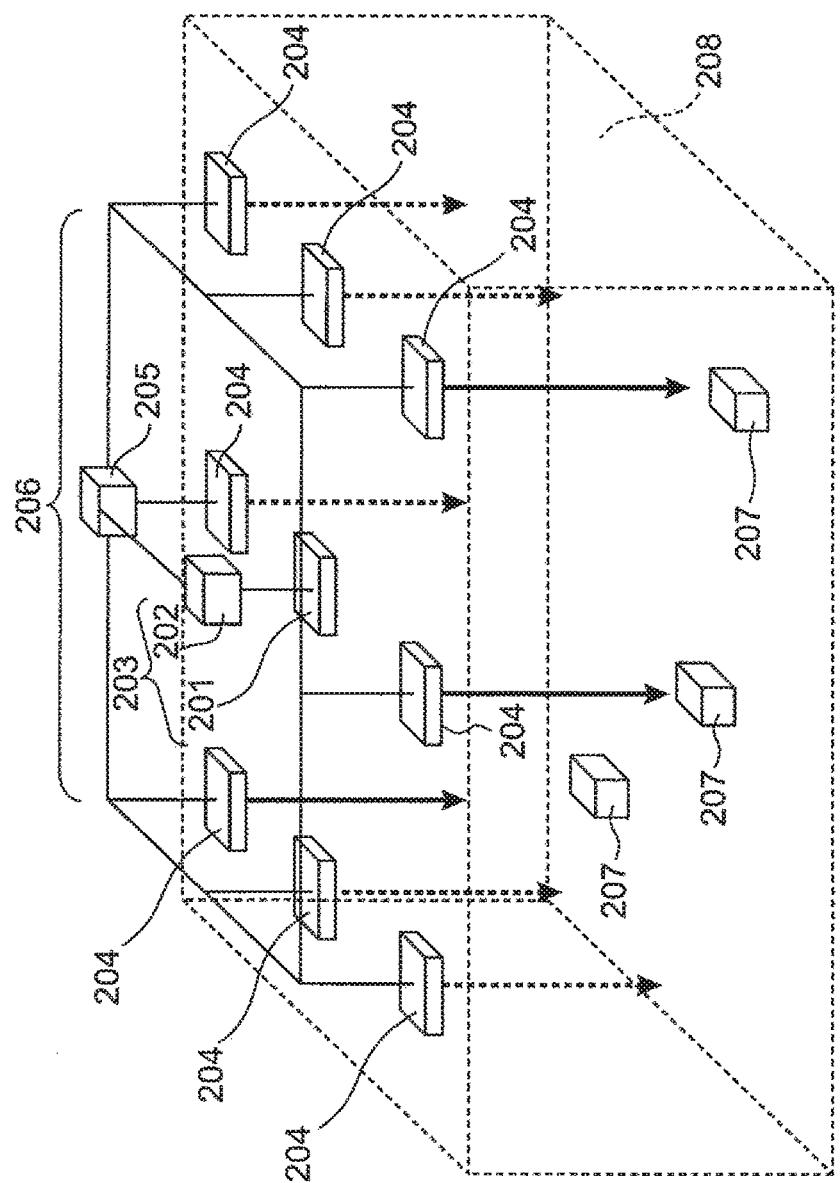
FIG. 8 is an explanatory diagram illustrating a selection method of a power transmission antenna of the slave power transmission apparatus in the case where the plurality of power reception apparatuses are present.
Figure 9:
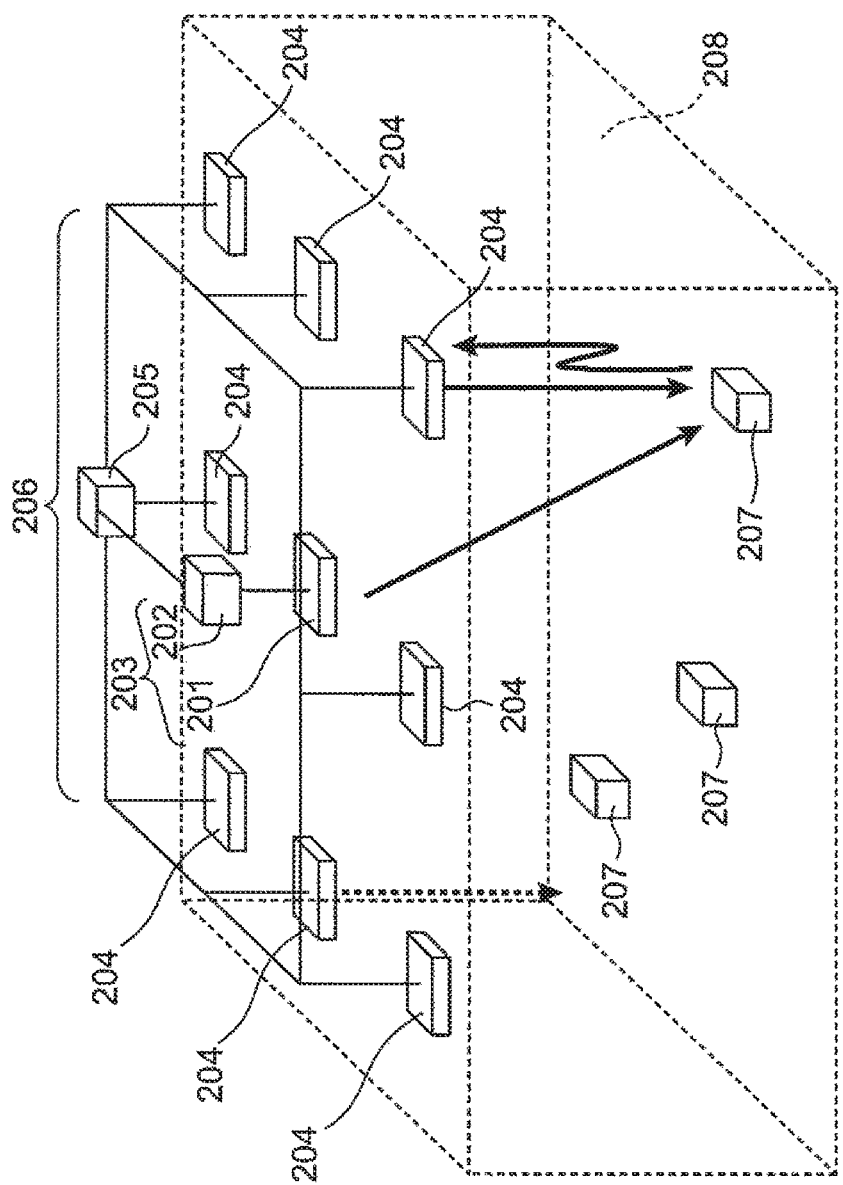
FIG. 9 is an explanatory diagram illustrating a phase adjustment method of the slave power transmission apparatus in the case where the plurality of power reception apparatuses are present.

Next, step S3 and S4, an adjustment method of slave power transmission apparatus 206 will be described by using FIG. 8.

After second step S2 is completed, as a state where the power transmission of master power transmission apparatus 203 is stopped, second controller 205a of second power transmission device 205 of slave power transmission apparatus 206 to which the adjustment completion signal is received from first power transmission device 202 of master power transmission apparatus 203 first performs the power transmission from second microwave generator 205c by switching second power transmission antennas 204 to be sequentially transmitted, as step S3a in step S3.

As step S3b in step S3, the amount of the received electric power of first power reception apparatus 207 in which the adjustment is performed is obtained by second information obtainer 205e from the first power reception apparatus 207 by the wireless communication, second power transmission antenna 204 having the highest amount of the received electric power of power reception apparatus 207 among second power transmission antennas 204 is selected by second controller 205a of second power transmission device 205, and selected second power transmission antenna 204 is stored in second storage 205b.

A method of these steps S3a and S3b is sequentially performed in each of the detected plurality of power reception apparatuses 207, second power transmission antenna 204 corresponding to each of power reception apparatuses 207 is selected by second power transmission device 205, and selected second power transmission antenna 204 is stored in second storage 205b.

Next, in step S4, master power transmission apparatus 203 transmits the electric power to each of the plurality of power reception apparatuses 207 in the power transmission direction stored in first storage 202b.

At the same time, slave power transmission apparatus 206 transmits the electric power by second power transmission antenna 204 stored in second storage 205b.

In this state, the amount of the received electric power of power reception apparatus 207 is obtained by second information obtainer 205e of slave power transmission apparatus 206 by the wireless communication.

Based on the amount of the received electric power from power reception apparatus 207 obtained by second information obtainer 205e, the phase of the microwave generated from second power transmission device 205 of second microwave generator 205c of slave power transmission apparatus 206 is adjusted by second controller 205a, and the phase is adjusted to a phase in which the amount of the received electric power from power reception apparatus 207 becomes the largest by second controller 205a.

By sequentially performing this method with respect to each of the plurality of power reception apparatuses 207, adjustments of the power transmission direction of master power transmission apparatus 203, and selection and the phase of a power transmission antenna of slave power transmission apparatus 206 is completed with respect to the plurality of power reception apparatuses 207, and the adjustment completed result is stored in first storage 202b and second storage 205b.

In a state where the adjustment completion is stored in first storage 202b and second storage 205b, in step S5, master power transmission apparatus 203 and slave power transmission apparatus 206 sequentially perform the power transmission at the same time with respect to each of power reception apparatuses 207 under the control of first controller 202a and second controller 205a based on the stored information.

As a method of sequentially transmitting the electric power to the plurality of power reception apparatuses 207, first controller 202a can arbitrarily determine a method in which a state of the power reception apparatus of one with less reception electric power or the like is obtained by first information obtainer 202d of master power transmission apparatus 203 in, for example, step S2, a higher order of priority, a predetermined method, and the like.

According to the method of the above-described various modification examples, it is possible to efficiently supply the high electric power to power reception apparatuses 207 arranged in the wide space, without the radio wave interference by using the plurality of power transmission apparatus (master power transmission apparatus 203 and slave power transmission apparatus 206).

Although this disclosure has been described based on the embodiment and the modifications, it is a matter of course that this disclosure is not limited to the above embodiment and modification examples.

The following cases are also included in this disclosure.

Specifically, a part or all of first controller 202a and second controller 205a is a computer system including a processor, for example, a microprocessor, a ROM, a RAM, a hard disk unit, a display unit, a keyboard, a mouse, and the like.

A computer program is stored in the RAM or the hard disk unit.

The microprocessor is operated in accordance with the computer program such that a part or all thereof achieve respective functions.

Here, in order to achieve a predetermined function, the computer program is configured by combining a plurality of instruction codes indicating instructions to the computer.

For example, each component can be realized by reading and executing a software program recorded on a recording medium such as a hard disk and a semiconductor memory by a program executing unit such as a CPU.

The software for realizing a part or all of elements constituting control devices in the embodiment or the modification examples is the following program.

That is, the program causing a computer used in the wireless power feeding method for transmitting electric power to one power reception apparatus to a plurality of power transmission apparatuses by using a wireless power feeding system, in which the plurality of the power transmission apparatuses are configured with a master power transmission apparatus including a first power transmission device and a first power transmission antenna connected to the first power transmission device and a slave power transmission apparatus including a second power transmission device and a plurality of the second power transmission antennas connected to the second power transmission device, the method including: a first step of detecting the power reception apparatus within a power transmission range of the master power transmission apparatus by the master power transmission apparatus; a second step of detecting a direction of the first power transmission antenna in which the amount of the electric power received by the power reception apparatus becomes maximum, by performing power transmission from the master power transmission apparatus to the power reception apparatus, while changing a direction of the first power transmission antenna of the master power transmission apparatus, in a state where the power transmission from the slave power transmission apparatus is stopped; a third step of detecting the second power transmission antenna in which the amount of the electric power received by the power reception apparatus becomes maximum, by performing the power transmission from the slave power transmission apparatus to the power reception apparatus while sequentially switching the plurality of the second power transmission antennas of the slave power transmission apparatus one by one by stopping the power transmission from the master power transmission apparatus; a fourth step of adjusting a phase of at least one radio wave transmitted from the master power transmission apparatus and the slave power transmission apparatus to a phase in which the amount of the electric power received by the power reception apparatus becomes maximum while performing the power transmission from both the first power transmission antenna and the detected second power transmission antenna to the power reception apparatus; and a fifth step of transmitting the electric power from both the first power transmission antenna and the detected second power transmission antenna to the power reception apparatus based on the adjusted phase.

In addition, this program may be executed by being downloaded from a server or the like, and may be executed by reading a program recorded in a predetermined recording medium (for example, optical disk such as CD-ROM, magnetic disk, semiconductor memory, or the like).

In addition, the computer that executes this program may be a single computer or a plurality of computers.

That is, a concentrated process may be performed, or a distributed process may be performed.

By suitably combining arbitrary embodiments or modification examples of the various embodiments or modification examples, it is possible to achieve effects including them.

That is, it is possible to combine the embodiments or to combine the modification examples, or to combine the embodiment and the modification examples, and also to combine the features in different embodiments or modification examples.

The wireless power feeding method according to the above-described aspect of the present disclosure can transmit the high electric power to the power reception apparatuses arranged in the wide space, and can be used in various applications such as a house and a facility, whereby it is possible to implement a power source by a cordless manner.

What is claimed is:

1. A wireless power feeding method for transmitting electric power to one power reception apparatus by a plurality of power transmission apparatuses using a wireless power feeding system, in which the plurality of the power transmission apparatuses are configured with a master power transmission apparatus including a first power transmission device and a first power transmission antenna connected to the first power transmission device and a slave power transmission apparatus including a second power transmission device and a plurality of second power transmission antennas connected to the second power transmission device, the method comprising:

a first step of detecting the power reception apparatus within a power transmission range of the master power transmission apparatus by the master power transmission apparatus;

a second step of detecting a direction of the first power transmission antenna of the master power transmission apparatus in which an amount of the electric power received by the power reception apparatus becomes maximum, by performing power transmission from the master power transmission apparatus to the power reception apparatus, while changing a direction of the first power transmission antenna, in a state where the power transmission from the slave power transmission apparatus is stopped;

a third step of detecting one of the plurality of the second power transmission antennas of the slave power transmission apparatus in which the amount of the electric power received by the power reception apparatus becomes maximum, by performing the power transmission from the slave power transmission apparatus to the power reception apparatus while sequentially switching the plurality of the second power transmission antennas one by one by stopping the power transmission from the master power transmission apparatus;

a fourth step of adjusting a phase of at least one radio wave transmitted from the master power transmission apparatus and the slave power transmission apparatus to a phase in which the amount of the electric power received by the power reception apparatus becomes maximum, while performing the power transmission from both the first power transmission antenna and the detected second power transmission antenna to the power reception apparatus; and a fifth step of transmitting the electric power from both the first power transmission antenna and the detected second power transmission antenna to the power reception apparatus based on the adjusted phase.

2. The wireless power feeding method of claim 1,
wherein the plurality of the power transmission apparatuses are configured with one master power transmission apparatus that is the master power transmission apparatus, a first slave power transmission apparatus that is the slave power transmission apparatus, and a second slave power transmission apparatus that is the slave power transmission apparatus different from the first slave power transmission apparatus, after the second step, in the first slave power transmission apparatus, detection of the second power transmission antenna of the first slave power transmission apparatus in which the amount of the electric power received by the power reception apparatus becomes maximum is performed in the third step and the phase adjustment is performed in the fourth step, before the fifth step, in the second slave power transmission apparatus, detection of the second power transmission antenna of the second slave power transmission apparatus in which the amount of the electric power received by the power reception apparatus becomes maximum is performed again in the third step, and the phase adjustment is performed in the fourth step, and in the fifth step, the power transmission is performed in the master power transmission apparatus, the first slave power transmission apparatus, and the second slave power transmission apparatus at the same time.

3. The wireless power feeding method of claim 1,
wherein in the first step, when it is detected that a plurality of the power reception apparatuses are present within the power transmission range of the master power transmission apparatus by detecting the power reception apparatus within the power transmission range of the master power transmission apparatus by the master power transmission apparatus, the second to fourth steps are sequentially performed with respect to each of the plurality of the power reception apparatuses, and in the fifth step, the power transmission is sequentially performed with respect to each of the plurality of the power reception apparatuses based on a phase adjustment result of each of the plurality of the power reception apparatuses.

4. The wireless power feeding method of claim 2, wherein in the first step, when it is detected that the plurality of the power reception apparatuses are present within the power transmission range of the master power transmission apparatus by detecting the power reception apparatus within the power transmission range of the master power transmission apparatus by the master power transmission apparatus, the second to fourth steps are performed with respect to each of the plurality of the power reception apparatuses, and in the fifth step, the power transmission is sequentially performed with respect to each of the plurality of the power reception apparatuses based on a phase adjustment result of each of the plurality of power reception apparatuses.

5. The wireless power feeding method of claim 3, wherein in the second step, the master power transmission apparatus detects power reception information of the plurality of the power reception apparatuses within the power transmission range of the master power transmission apparatus, and in the fifth step, an order of transmitting the electric power is determined based on the detected power reception information of the power reception apparatus in the second step.

6. The wireless power feeding method of claim 4, wherein in the second step, the master power transmission apparatus detects power reception information of the plurality of the power reception apparatuses within the power transmission range of the master power transmission apparatus, and in the fifth step, an order of transmitting the electric power is determined based on the detected power reception information of the power reception apparatus in the second step.

* * * * *